(12) United States Patent
Rana et al.

(10) Patent No.: US 11,605,710 B2
(45) Date of Patent: Mar. 14, 2023

(54) TRANSISTOR WITH AIR GAP UNDER SOURCE/DRAIN REGION IN BULK SEMICONDUCTOR SUBSTRATE

(71) Applicant: GLOBALFOUNDRIES U.S. Inc., Santa Clara, CA (US)

(72) Inventors: Uzma B. Rana, Slingerlands, NY (US); Anthony K. Stamper, Burlington, VT (US); Steven M. Shank, Jericho, VT (US); Srikanth Srihari, Bangalore (IN)

(73) Assignee: GlobalFoundries U.S. Inc., Santa Clara, CA (US)

( * ) Notice: Subject to any disclaimer, the term of this patent is extended or adjusted under 35 U.S.C. 154(b) by 44 days.

(21) Appl. No.: 17/155,469

(22) Filed: Jan. 22, 2021

(65) Prior Publication Data
US 2022/0190108 A1    Jun. 16, 2022

(30) Foreign Application Priority Data

Dec. 11, 2020    (IN) .............................. 202011053972

(51) Int. Cl.
*H01L 29/06* (2006.01)
*H01L 29/78* (2006.01)
(Continued)

(52) U.S. Cl.
CPC ...... *H01L 29/0653* (2013.01); *H01L 29/7848* (2013.01)

(58) Field of Classification Search
CPC .......... H01L 29/7848; H01L 29/66636; H01L 29/1083; H01L 21/764; H01L 21/7682;
(Continued)

(56) References Cited

U.S. PATENT DOCUMENTS

| 8,067,290 B2 | 11/2011 | Boeck et al. |
| 9,070,734 B2 | 6/2015 | Camillo-Castillo et al. |

(Continued)

OTHER PUBLICATIONS

"Wafer With Localized Semiconductor on Insulator Regions With Cavity Structures", U.S. Appl. No. 17/003,179, filed Aug. 26, 2020.
(Continued)

*Primary Examiner* — Sonya McCall-Shepard
(74) *Attorney, Agent, or Firm* — Anthony Canale; Hoffman Warnick LLC

(57) ABSTRACT

A transistor includes a bulk semiconductor substrate, and a first source/drain region in the bulk semiconductor substrate separated from a second source/drain region in the bulk semiconductor substrate by a channel region. A first air gap is defined in the bulk semiconductor substrate under the first source/drain region, and a second air gap is defined in the bulk semiconductor substrate under the second source/drain region. A gate is over the channel region. A spacing between the first air gap and the second air gap is greater than or equal to a length of the channel region such that the first and second air gaps are not under the channel region. The air gaps may have a rectangular cross-sectional shape. The air gaps reduce off capacitance of the bulk semiconductor structure to near semiconductor-on-insulator levels without the disadvantages of an air gap under the channel region.

10 Claims, 8 Drawing Sheets

(51) Int. Cl.
 *H01L 29/66*  (2006.01)
 *H01L 29/04*  (2006.01)
 *H01L 29/10*  (2006.01)

(58) Field of Classification Search
 CPC ......... H01L 29/4991; H01L 21/823412; H01L 21/823807; H01L 29/0649–0653; H01L 21/7624–76291; H01L 27/1203–1211; H01L 29/0653
 See application file for complete search history.

(56) References Cited

U.S. PATENT DOCUMENTS

| | | |
|---|---|---|
| 9,159,817 B2 | 10/2015 | Camillo-Castillo et al. |
| 9,202,900 B2 | 12/2015 | Adkisson et al. |
| 9,318,551 B2 | 4/2016 | Camillo-Castillo et al. |
| 9,368,608 B1 | 6/2016 | Camillo-Castillo et al. |
| 10,192,779 B1 | 1/2019 | Shank et al. |
| 10,388,728 B1 | 8/2019 | Zierak et al. |
| 10,461,152 B2 | 10/2019 | Stamper et al. |
| 10,720,494 B2 | 7/2020 | Shank et al. |
| 2005/0093021 A1* | 5/2005 | Ouyang ............... H01L 29/1054 257/E21.431 |
| 2005/0176222 A1* | 8/2005 | Ogura .................. H01L 21/764 257/E21.573 |
| 2009/0072351 A1* | 3/2009 | Meunier-Beillard ........................ H01L 21/76264 257/E29.089 |
| 2016/0071925 A1* | 3/2016 | Jaffe ................. H01L 21/26533 438/295 |
| 2019/0229184 A1 | 7/2019 | Shank et al. |

OTHER PUBLICATIONS

"Semiconductor on Insulator Wafer With Cavity Structures", U.S. Appl. No. 17/028,178, filed Sep. 22, 2020.

* cited by examiner

US 11,605,710 B2

TRANSISTOR WITH AIR GAP UNDER SOURCE/DRAIN REGION IN BULK SEMICONDUCTOR SUBSTRATE

BACKGROUND

The present disclosure relates to integrated circuits (ICs), and more specifically, to a transistor including an air gap under source/drain regions in a bulk semiconductor substrate to reduce junction capacitance to near semiconductor-on-insulator (SOI) substrate levels.

Advanced manufacturing of ICs requires formation of individual circuit elements, e.g., transistors such as field-effect-transistors (FETs) and the like, based on specific circuit designs. A FET generally includes source, drain, and gate regions. The gate region is placed between the source and drain regions and controls the current through a channel region between the source and drain regions. Gates may be composed of various metals and often include a work function metal, which is chosen to create desired characteristics of the FET. Transistors may be formed over a substrate and may be electrically isolated with an insulating dielectric layer, e.g., inter-level dielectric (ILD) layer or highly resistive polycrystalline layer. Contacts may be formed to each of the source, drain, and gate regions in order to electrically connect the transistor to other circuit elements that may be formed subsequent to the transistor in other metal levels.

The substrates used to form ICs generally fall into two categories: bulk semiconductor and semiconductor-on-insulator (SOI) substrates. SOI substrates include a layered semiconductor-insulator-semiconductor substrate in place of a more conventional bulk semiconductor substrate. More particularly, SOI substrates include a thin semiconductor-on-insulator (SOI) layer over a buried insulator layer over a base semiconductor layer. SOI substrates are more expensive to fabricate than bulk semiconductor substrates, but generally provide better performing ICs. For example, bulk semiconductor substrates have a higher n-type field effect transistor (NFET) off capacitance ($C_{off}$) due to their required relatively large source/drain junction area. The $C_{off}$ of bulk semiconductor technologies can be approximately 30% higher than that of SOI substrates due to the source/drain junction capacitance. One approach to improve bulk semiconductor substrate performance includes positioning an air gap under a channel region of the transistor. However, this approach increases the variability of the voltage at which the transistor turns on, i.e., its threshold voltage, and creates a mechanical stress on the channel region, making this approach difficult to use.

SUMMARY

An aspect of the disclosure is directed to a transistor, comprising: a bulk semiconductor substrate; a first source/drain region in the bulk semiconductor substrate separated from a second source/drain region in the bulk semiconductor substrate by a channel region; a first air gap defined in the bulk semiconductor substrate and under the first source/drain region; a second air gap defined in the bulk semiconductor substrate and under the second source/drain region; and a gate over the channel region, wherein a spacing between the first air gap and the second air gap is greater than or equal to a length of the channel region such that the first and second air gaps are not under the channel region.

Another aspect of the disclosure includes a transistor, comprising: a bulk semiconductor substrate; a first source/drain region in the bulk semiconductor substrate separated from a second source/drain region in the bulk semiconductor substrate by a channel region; a first air gap defined in the bulk semiconductor substrate and in direct contact with the first source/drain region; a second air gap defined in the bulk semiconductor substrate and in direct contact with the second source/drain region; a gate over the channel region; and a doped polysilicon isolation region in the bulk semiconductor substrate extending below the trench isolation and under the gate, the first source/drain region and the second source/drain region, wherein the first air gap and the second air gap each have a substantially rectangular cross-sectional shape, and a spacing between the first air gap and the second air gap is greater than or equal to a length of the channel region such that the first and second air gaps are not under the channel region.

An aspect of the disclosure related to a method, comprising: forming a first silicon-germanium (SiGe) section and a second SiGe section spaced from the first SiGe section on a bulk semiconductor substrate; forming a silicon layer over the first SiGE section and the second SiGe section; forming a first source/drain region in the silicon layer and a second source/drain region in the silicon layer; forming a gate over a channel region between the first source/drain region and the second source/drain region; forming a first air gap under the first source/drain region and a second air gap under the second source/drain region by removing the first SiGe section and the second SiGe section from under the silicon layer, wherein a spacing between the first air gap and the second air gap is greater than or equal to a length of the channel region such that the air gaps are not under the channel region.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein.

Figure 1:
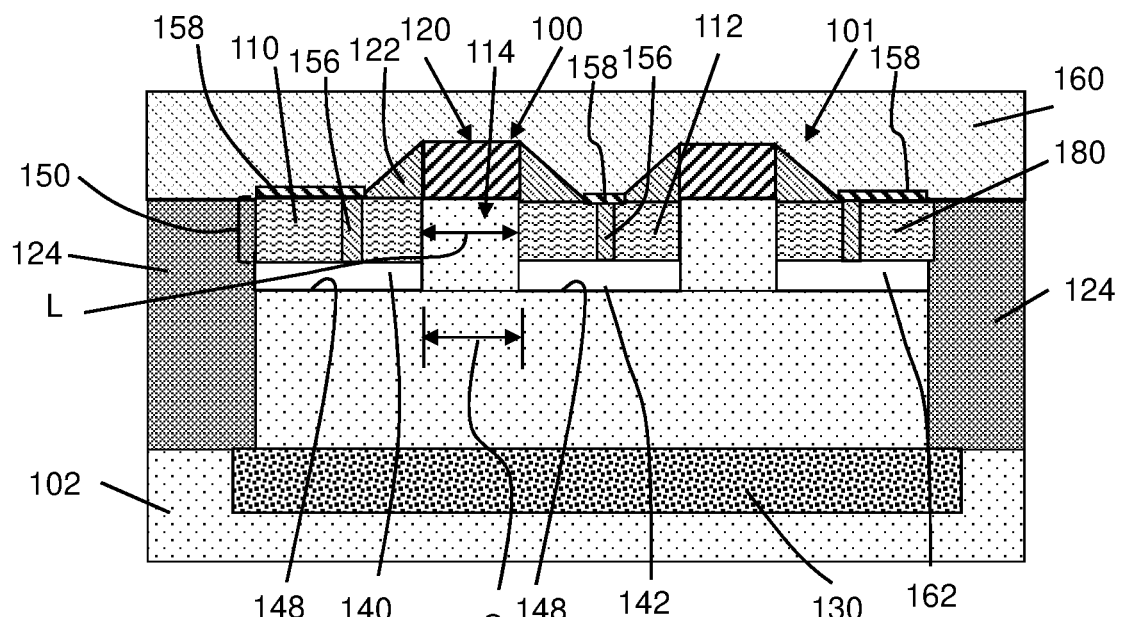
FIG. 1 shows a cross-sectional view of a transistor, according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific illustrative embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element such as a layer, region, or substrate is referred to as being "on" or "over" another element, it may be directly on the other element or intervening elements may also be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (a) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

Embodiments of the disclosure provide a transistor that includes a bulk semiconductor substrate, and a first source/drain region in the bulk semiconductor substrate separated from a second source/drain region in the bulk semiconductor substrate by a channel region. A first air gap is defined in the bulk semiconductor substrate under the first source/drain region, and a second air gap is defined in the bulk semiconductor substrate under the second source/drain region. A gate is over the channel region. A spacing between the first air gap and the second air gap is greater than or equal to a length of the channel region such that the first and second air gaps are not under the channel region. The air gaps may have a rectangular cross-sectional shape. The air gaps reduce off capacitance of the bulk semiconductor structure to near semiconductor-on-insulator levels without the disadvantages of an air gap under the channel region. The source/drain regions have a thickness that is in the range of SOI layers of SOI substrates.

FIG. 1 shows a cross-sectional view of a pair of adjacent transistors 100, 101, according to embodiments of the disclosure. These transistors 100, 101 could form a single multi-finger transistor or two separate transistors. For purposes of description, only one transistor 100 (left side) will be described herein, the other transistor 101 (right side) is generally a mirror image of the one transistor and they may share a middle source/drain region. Transistor 100 includes a semiconductor substrate 102 that, in an illustrative embodiment, is a bulk semiconductor substrate and not a semiconductor on insulator (SOI) substrate. Semiconductor substrate 102 may include but is not limited to silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and $X1+X2+X3+Y1+Y2+Y3+Y4=1$ (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and $A1+A2+B1+B2=1$ (1 being a total mole quantity). Furthermore, a portion or entire semiconductor substrate 102 may be strained.

Transistor 100 also includes a first source/drain region 110 in bulk semiconductor substrate 102 separated from a second source/drain region 112 in bulk semiconductor substrate 102 by a channel region 114. Source/drain regions 110, 112 may include any appropriate dopants.

A gate 120 is over channel region 114. Gate 120 may include any now known or later developed gate material. In one non-limiting example, gate 120 may include polysilicon. In another example, gate 120 may include a metal gate. Although shown as a single material for clarity, metal gates may include one or more conductive components for providing a gate terminal of a transistor. For example, metal gates may include a high dielectric constant (high-K) layer, a work function metal layer and a gate conductor (not all shown for clarity). The high-K layer may include any now known or later developed high-K material typically used for metal gates such as but not limited to: metal oxides such as tantalum oxide ($Ta_2O_5$), barium titanium oxide ($BaTiO_3$), hafnium oxide ($HfO_2$), zirconium oxide ($ZrO_2$), aluminum oxide ($Al_2O_3$) or metal silicates such as hafnium silicate oxide ($Hf_{A1}Si_{A2}O_{A3}$) or hafnium silicate oxynitride ($Hf_{A1}Si_{A2}O_{A3}N_{A4}$), where A1, A2, A3, and A4 represent relative proportions, each greater than or equal to zero and A1+A2+A3+A4 (1 being the total relative mole quantity). The work function metal layer may include various metals depending on whether for an NFET or PFET device, but may include, for example: aluminum (Al), zinc (Zn), indium (In), copper (Cu), indium copper (InCu), tin (Sn), tantalum (Ta), tantalum nitride (TaN), tantalum carbide (TaC), titanium (Ti), titanium nitride (TiN), titanium carbide (TiC), TiAlC, TiAl, tungsten (W), tungsten nitride (WN), tungsten carbide (WC), polycrystalline silicon (poly-Si), and/or combinations thereof. The gate conductor may include any now known or later developed gate conductor such as copper (Cu). A gate cap (not shown) of, for example, a nitride may also be formed over the gate region. Gate 120 may also include a spacer 122 thereabout, e.g., of silicon nitride.

Transistor 100 may also include any form of a trench isolation 124 in bulk semiconductor substrate 102 and surrounding first source/drain region 110 and second source/drain region 112. As understood in the art, trench isolation 124 may isolate one region of substrate 102 from an adjacent region of substrate 102. One or more transistors of a given polarity may be disposed within an area isolated by trench isolation 124. Each trench isolation 124 may be formed of any currently-known or later developed substance for providing electrical insulation, and as examples may include: silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, a spin-on silicon-carbon containing polymer material, near frictionless carbon (NFC), or layers thereof.

Figure 2:
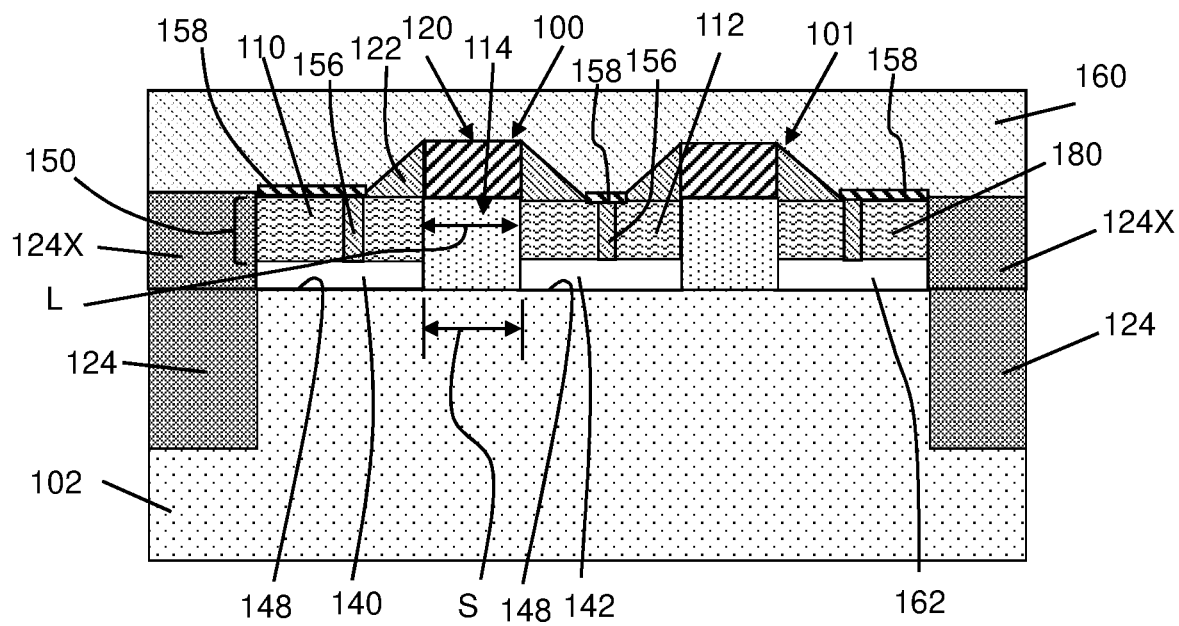
FIG. 2 shows a cross-sectional view of a transistor, according to other embodiments of the disclosure.

In one embodiment, transistor 100 may also include a doped polysilicon isolation region 130 in bulk semiconductor 102 extending below gate 120, first source/drain region 110 and second source/drain region 112. Isolation region 130 may extend between sides of trench isolation 124. Doped polysilicon isolation region 130 may include any dopant capable of forming an insulative polysilicon, e.g., argon, in substrate 102. As understood in the art, doped polysilicon isolation region 130 provides high resistivity electrical isolation for transistor 100. FIG. 2 shows a cross-sectional view of another embodiment in which doped polysilicon isolation region 130 is omitted.

Figure 3:
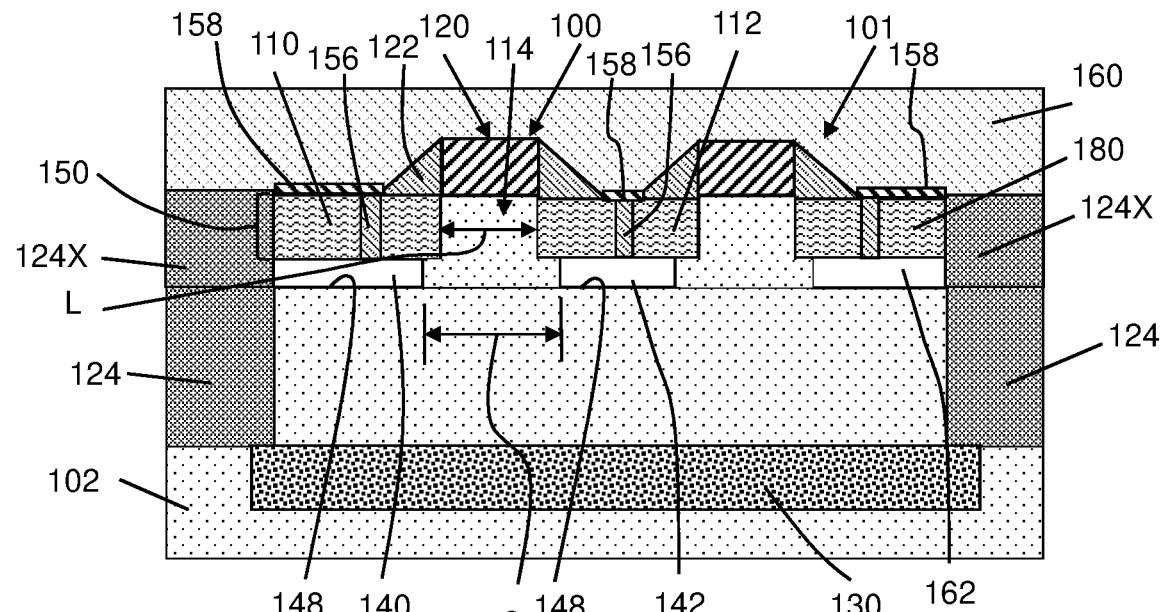
FIG. 3 shows a cross-sectional view of a transistor, according to yet other embodiments of the disclosure.

Transistor 100 includes a first air gap 140 defined in bulk semiconductor substrate 102 and under first source/drain region 110, and a second air gap 142 defined in bulk semiconductor substrate 102 and under second source/drain region 112. Air gaps 140, 142 are cavities or voids in the material of transistor 100 that act as gas dielectrics. A spacing S between first air gap 140 and second air gap 142 is greater than or equal to a length L of channel region 114 such that first and second air gaps 140, 142 are not under channel region 114. In FIGS. 1 and 2, sides of first air gap 140 and second air gap 142 are aligned to edges of gate 120 and channel 114 such that spacing S is equal to length L of channel region 114. Alternatively, as shown in FIG. 3, sides of first air gap 140 and second air gap 142 may not be aligned to edges of gate 120 and channel 114, such that spacing S is greater than length L of channel region 114. FIG. 3 shows transistor 100 including doped polysilicon isolation region 130, but it may be omitted as in FIG. 2.

First air gap 140 is in direct contact with first source/drain region 110, and second air gap 142 is in direct contact with second source/drain region 112. In addition, first air gap 140 and/or second air gap 142 may abut trench isolation 124, i.e., ends thereof are in direct contact with trench isolation 124. In FIGS. 1-3, only first air gap 140 is shown abutting trench isolation 124; it is recognized however that if transistor 101 is omitted, second air gap 142 would abut trench isolation 124. In addition, due to the method of forming the air gaps, as will be further described herein, first air gap 140 and second air gap 142 each have a substantially rectangular cross-sectional shape. Air gaps 140, 142 may be formed without a liner therein such that an inner surface 148 of each of first air gap 140 and second air gap 142 is the same material as bulk semiconductor substrate 102.

As will be described herein, a silicon layer 150 in which first source/drain region 110 and second source/drain region 112 may have a thickness in the range of 30 to 50 nanometers. The thickness is, in part, determined by a thickness of air gaps 140, 142 and the material used to form them. Silicon layer 150 may have a thickness similar to that of a semiconductor-on-insulator (SOI) layer of an SOI substrate, and may provide similar performance as an SOI substrate using air gaps 140, 142 and optionally doped polysilicon isolation region 130, rather than a buried insulator layer.

For reasons that will be made apparent herein, transistor 100 may also include a filled vent hole 156 extending through each of first source/drain region 110 and second source/drain region 112. Filled vent holes 156 may be filled with, for example, an oxide liner and a spacer nitride. Each source/drain region 110, 112 may also include silicide 158 thereon for coupling to contacts (not shown) through an interlayer dielectric (ILD) 160. Silicide 158 may be formed using any now known or later developed technique, e.g., performing an in-situ pre-clean, depositing a metal such as titanium, nickel, cobalt, etc., annealing to have the metal react with silicon, and removing unreacted metal. ILD 160 may be deposited and include materials such as but not limited to: carbon-doped silicon dioxide materials; fluorinated silicate glass (FSG); organic polymeric thermoset materials; silicon oxycarbide; SiCOH dielectrics; fluorine doped silicon oxide; spin-on glasses; silsesquioxanes, including hydrogen silsesquioxane (HSQ), methyl silsesquioxane (MSQ) and mixtures or copolymers of HSQ and MSQ; benzocyclobutene (BCB)-based polymer dielectrics, and any silicon-containing low-k dielectric. Examples of spin-on low-k films with SiCOH-type composition using silsesquioxane chemistry include HOSP™ (available from Honeywell), JSR 5109 and 5108 (available from Japan Synthetic Rubber), Zirkon™ (available from Shipley Microelectronics, a division of Rohm and Haas), and porous low-k (ELk) materials (available from Applied Materials). Examples of carbon-doped silicon dioxide materials, or organosilanes, include Black Diamond™ (available from Applied Materials) and Coral™ (available from Lam Research). An example of an HSQ material is FOx™ (available from Dow Corning).

"Depositing" may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation. ILD 160 may be deposited using, for example, ALD.

It will be recognized that transistor 101 may include similar structure as transistor 100. In other embodiments, transistor 101 may be omitted. As illustrated, where pair of transistors 100, 101 exist, a third air gap 162 under another source/drain region 180 may be provided.

Referring to FIGS. 4-15, transistor 100 may be formed according to a variety of methods, according to embodiments of the disclosure. FIGS. 4-10 show embodiments in which sides of air gaps 140, 142 may not be aligned with source/drain regions 110, 112. FIGS. 11-15 show cross-sectional view of embodiments in which processing in which sides of air gaps 140, 142 are aligned with source/drain regions 110, 112.

Figure 4:
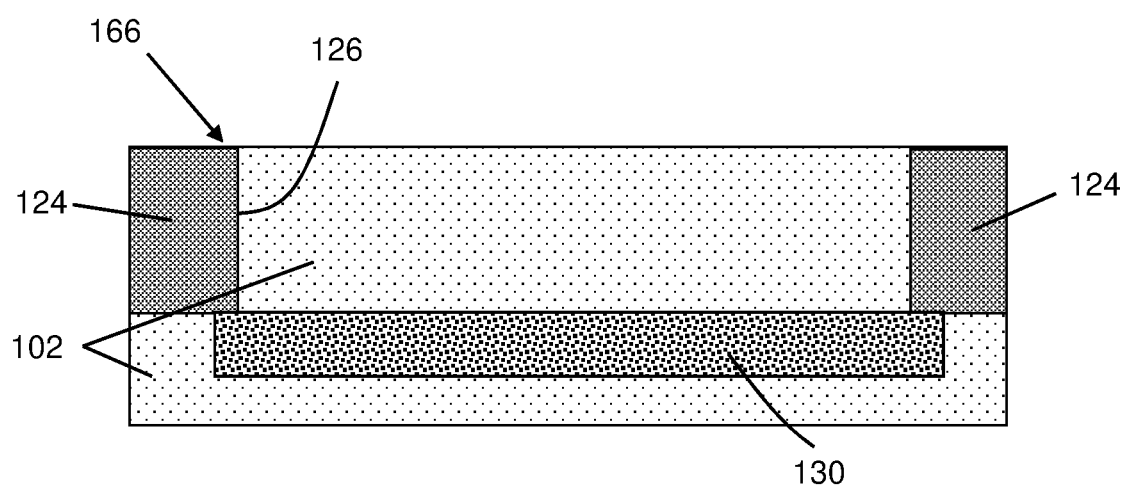
FIG. 4 shows a cross-sectional view of a preliminary structure for a method, according to embodiments of the disclosure.

FIG. 4 shows a cross-sectional view of one embodiment of a preliminary structure 166 according to embodiments of the disclosure. Preliminary structure 166 may include bulk semiconductor substrate 102, as described herein. FIG. 4 also shows forming a trench isolation 124 in bulk semiconductor substrate 102. Here, a trench 126 may be etched into substrate 102, e.g., using a mask (not shown) and filled with an insulating material such as oxide, to isolate one region of the substrate from an adjacent region of the substrate. Trench isolation 124 surrounds the area in which transistor(s) 100 will be built. Any of trench isolation 124 materials listed herein may be used. Alternatively, an appropriately doped well may be used as an isolation.

Etching generally refers to the removal of material from a substrate (or structures formed on the substrate), and is often performed with a mask (not shown) in place so that material may selectively be removed from certain areas of the substrate, while leaving the material unaffected, in other areas of the substrate. There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g. silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases, which approach the wafer approximately from one direction, and therefore this process is highly anisotropic. Reactive-ion etching (RIE) operates under conditions intermediate between sputter and plasma etching and may be used to produce deep, narrow features, such as trenches 126 for trench isolation 124.

FIG. 4 also shows an optional forming of a doped polysilicon isolation region 130 in bulk semiconductor substrate 102. Doped polysilicon isolation region 130 may be formed in any now known or later developed fashion, such as but not limited to doping, e.g., via ion implanting and annealing, argon with sufficient dosage and strength to form the isolation region at a desired depth in substrate 102. See U.S. Pat. No. 10,192,779. Any form of nitride cap (not shown) may be used to control the positioning and shape of isolation region 130. As shown in one non-limiting example in FIGS. 1 and 3, the doping forms doped polysilicon isolation region 130 in bulk semiconductor substrate 102 extending under first source/drain region 110, second source/drain region 112, gate 120, first air gap 140 and second air gap 142. Other arrangements of isolation region 130 are also possible.

Figure 5:
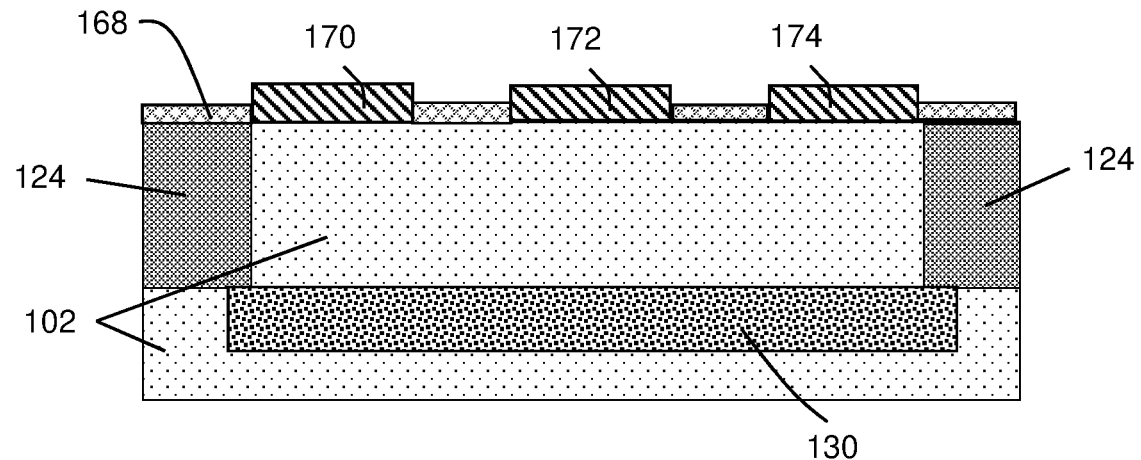
FIG. 5 shows a cross-sectional view of forming silicon germanium sections, according to embodiments of the disclosure.

FIG. 5 shows a cross-sectional view of forming a first silicon-germanium (SiGe) section 170 and a second SiGe section 172 spaced from first SiGe section 170 on bulk semiconductor substrate 102. A third SiGe section 174 may also be formed spaced from second SiGe section 172. In this embodiment, a mask 168 (e.g., nitride hard mask) is patterned over bulk semiconductor substrate 102, exposing portions of the substrate. Each SiGe section 170, 172, 174 may be selectively epitaxially grown in the exposed portions of the substrate, as directed by patterned mask 168 on substrate 102. The terms "epitaxial growth" and "epitaxially formed and/or grown" mean the growth of a semiconductor material such as silicon on a deposition surface of a semiconductor material, in which the semiconductor material being grown may have the same crystalline characteristics as the semiconductor material of the deposition surface. In an epitaxial growth process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. The addition of germanium (Ge) may be turned on during the epitaxial growth process to form SiGe, e.g., with a content of up to 20% Ge of the SiGe by weight percentage. Alternatively, the addition of germanium (Ge) may be turned off during the epitaxial growth process, allowing pure silicon to be formed. A thickness and width of SiGe sections 170, 172, 174 determines a thickness and width of air gaps 140, 142. SiGe sections 170, 172 are laterally positioned and have a width to match, as close as possible, that of source/drain regions 110, 112 to be formed thereover. SiGe sections 170, 172, 174 may have a width commensurate with, for example, a desired source/drain region width and channel length for a particular technology node in which employed. In one non-limiting example, for a 14 nm technology node, the width may be 360-400 nanometers, or the width may be 560-600 nanometers, or any width in between those ranges. SiGe sections 170, 172, 174 may have a thickness of, for example, 10-30 nm.

Figure 6:
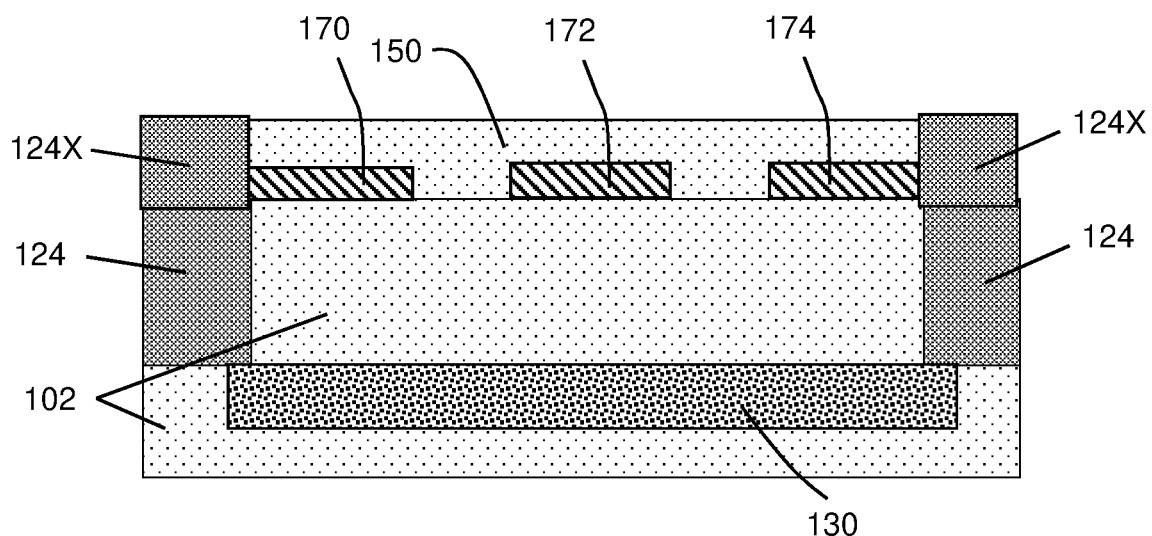
FIG. 6 shows a cross-sectional view of forming a silicon layer, according to embodiments of the disclosure.

FIG. 6 shows a cross-sectional view of forming silicon layer 150 over first SiGe section 170 and second SiGe section 172 (and third SiGe section 174, where provided). Here, mask 168 is first removed using any appropriate ashing process (e.g., a hot phosphorous process). Silicon layer 150 may then be selectively epitaxial grown from bulk semiconductor substrate 102 and SiGe sections 170, 172, 174. Silicon layer 150 may have any thickness desired for source/drain regions 110, 112. In one embodiment, a thickness of silicon layer 150 over SiGe sections 170, 172, 174 is made to approach that of SOI layers in SOI substrates to obtain similar performance as SOI substrates even though transistor 100 is formed on bulk semiconductor substrate 102. In one non-limiting example, silicon layer 150 may have a thickness in the range of 30 to 50 nanometers.

FIG. 6 also shows extending trench isolation 124 to be coplanar with silicon layer 150. Here, additional trench isolation 124X is formed over trench isolation 124 to bring the trench isolation to the same height as silicon layer 150. Any necessary planarization can be carried out to make the surfaces coplanar.

Figure 7:
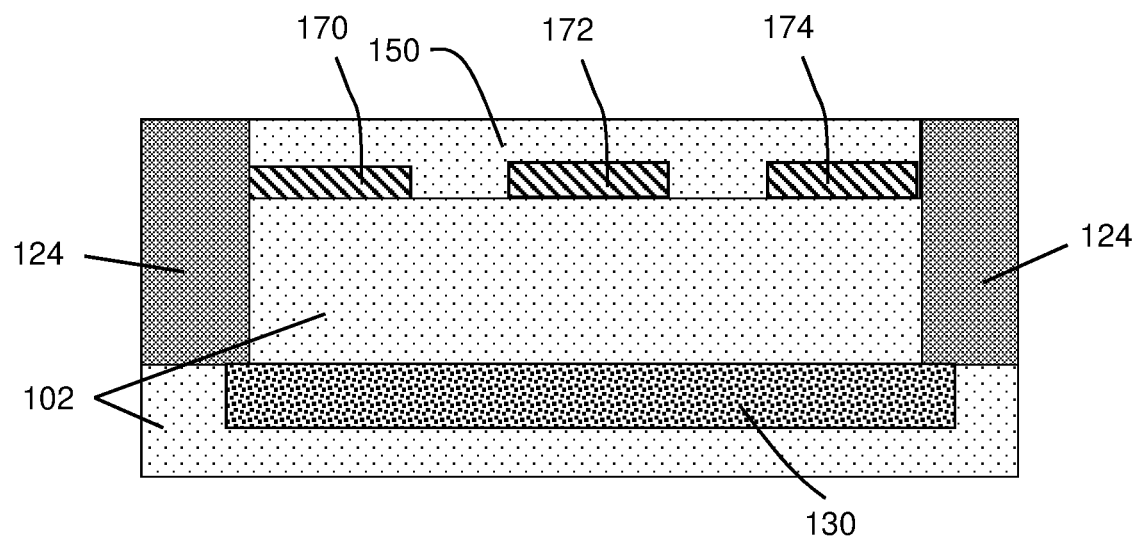
FIG. 7 shows a cross-sectional view of forming a trench isolation, according to embodiments of the disclosure.

In an alternative embodiment, shown in the cross-sectional view of FIG. 7, the optional doped polysilicon isolation region 130 formation of FIG. 4 and the processes of FIGS. 5 and 6 can be performed prior to trench isolation 124 formation. In this case, patterned mask 168 (FIG. 5) is used to expose portions of substrate 102, and first and second SiGe sections 170, 172 (FIG. 6), and third SiGe section 174 where provided, are epitaxially grown. Mask 168 is then removed, and as described relative to FIG. 6, silicon layer 150 is epitaxially grown. In this case, since trench isolation 124 is not initially present, silicon layer 150 grows in a non-selective manner from substrate 102 and SiGe sections 170, 172, 174. Subsequently, as shown in FIG. 7, trench isolation 124 may be formed in bulk semiconductor substrate 102 to be coplanar with silicon layer 150, e.g., using pad oxide and pad nitride mask to etch trenches, oxide deposition and planarization (not shown). Consequently, trench isolation 124 includes a unitary structure, e.g., of oxide. With further regard to the trench isolation, the FIG. 7 embodiment is shown in FIG. 1, and the FIG. 6 embodiment is shown in FIGS. 2 and 3. Subsequent processing up to that shown FIGS. 1-3 is illustrated based on the FIG. 7 embodiment.

Figure 8:
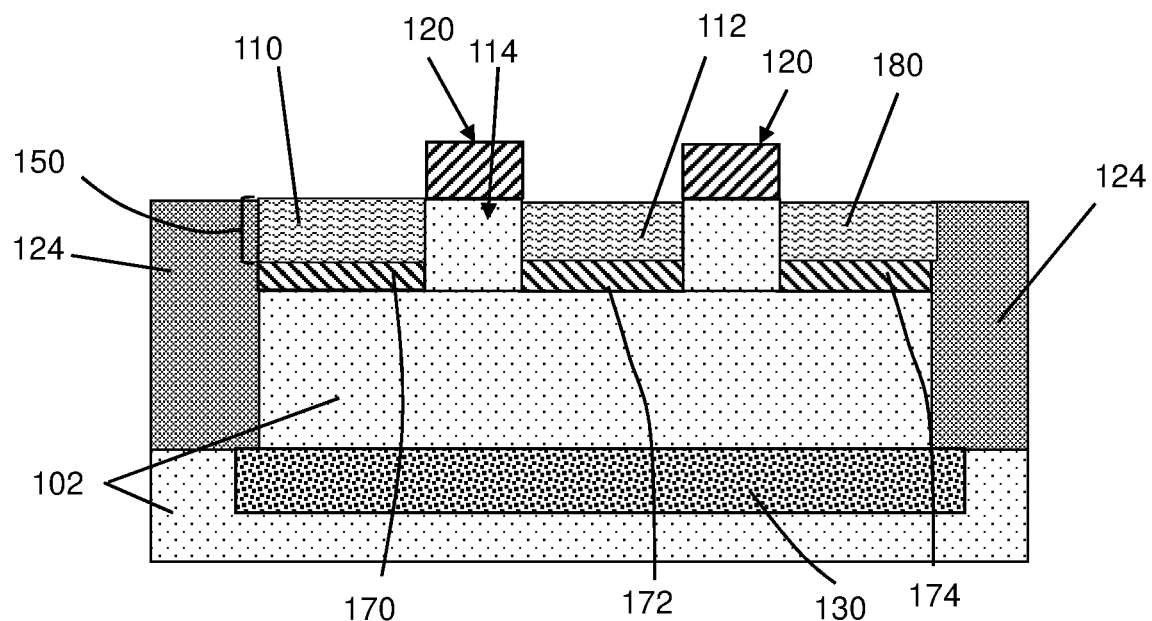
FIG. 8 shows a cross-sectional view of forming source/drain regions and a gate, according to embodiments of the disclosure.

FIG. 8 shows a cross-sectional view of forming first source/drain region 110 in silicon layer 150 and second source/drain region 112 in silicon layer 150. FIG. 8 also shows forming gate 120 over channel region 114 between first source/drain region 110 and second source/drain region 112. Gate 120 and source/drain regions 110, 112 (and second gate 120 and third source/drain region 180) may be formed using any now known or later developed processes. In one non-limiting example, gate(s) 120 material may be deposited and patterned using photolithography, and source/drain regions 110, 112, 180 formed by doping silicon layer 150 with appropriate dopants (e.g., using ion implanting), and annealing to drive in the dopants. The dopants used may vary depending on the type of transistor to be formed. Gate(s) 120 may include dummy gate material, e.g., including sacrificial material to be replaced with the final gate material after the source/drain regions' formation, or they may include the final gate material, e.g., polysilicon or metal gate material.

Figure 9:
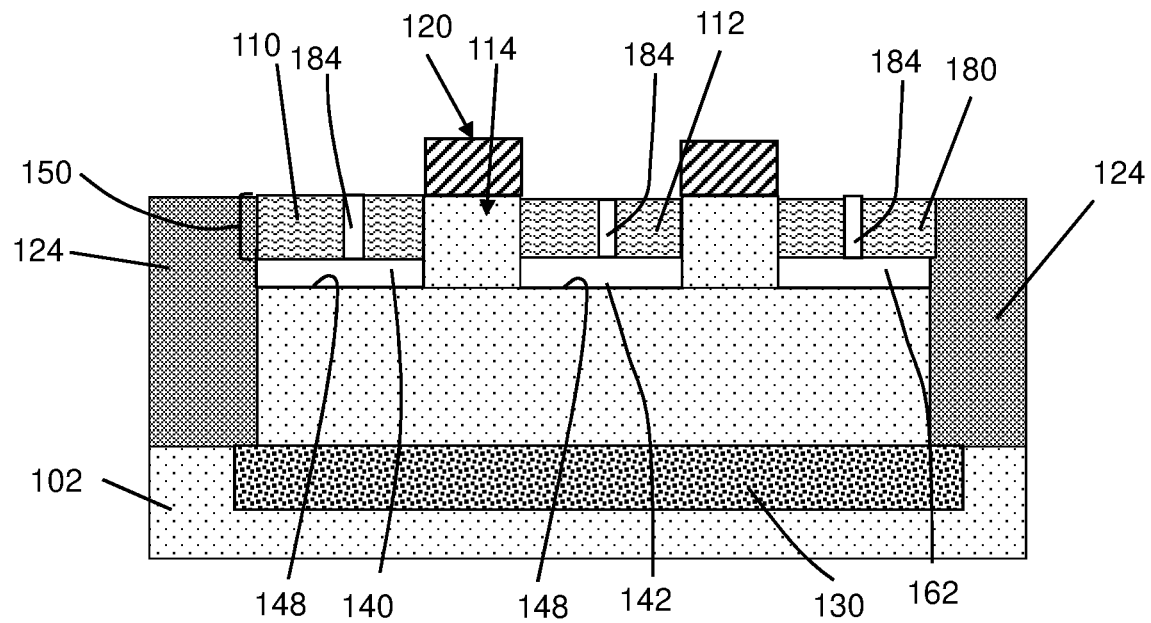
FIG. 9 shows a cross-sectional view of removing silicon germanium sections, according to embodiments of the disclosure.

FIG. 9 shows a cross-sectional view of forming first air gap 140 under first source/drain region 110 and second air gap 142 under second source/drain region 112 by removing first SiGe section 170 and second SiGe section 172 from under silicon layer 150 (now including source/drain regions 110, 112). Air gap 140, 142 forming under first and second source/drain regions 110, 112 may include forming a vent hole 184 through first source/drain region 110 and second source/drain region 112 (and source/drain region 180, where provided). Vent hole 184 may be formed using any now known or later developed process, e.g., forming a patterned mask having small openings matching the location of vent holes 184, and etching (e.g., a RIE). FIG. 9 also shows etching and removing SiGe layers 170, 172 (and 174 (FIG. 8)) using, for example, hot ammonia (NH$_3$) and/or hydrochloric acid, through vent holes 184, as known in the art. After the SiGe layers 170, 172, 174 are removed, an optional thermal oxidation to passivate the air gap semiconductor surfaces may be performed. The removal of SiGe sections leaves gas in the spaces, e.g., air.

Figure 10:
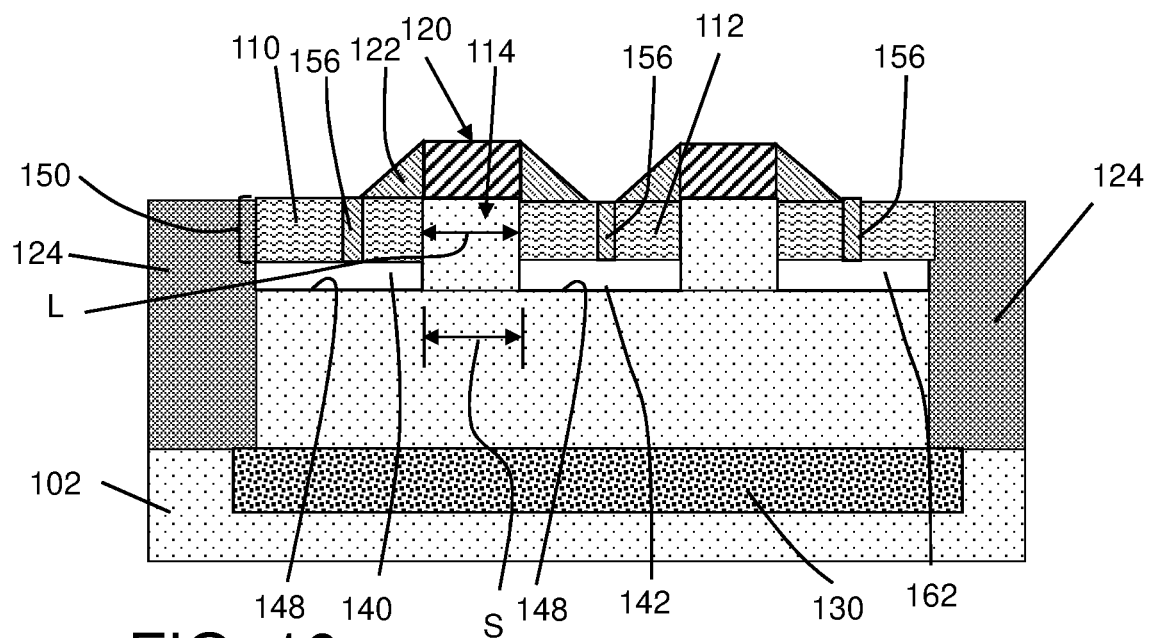
FIG. 10 shows a cross-sectional view of forming air gaps under source/drain regions, according to embodiments of the disclosure.

FIG. 10 shows a cross-sectional view of sealing vent holes 184 (FIG. 9) to form first air gap 140 and second air gap 142 (and third air gap 162, where desired), and filled vent holes 156. Sealing may be carried out, for example, by thermally oxidizing the vent hole (shown) or depositing a dielectric such as nitride and/or a spacer nitride, which also forms gate spacer 122, or by depositing boro-phospho-silicate glass (BPSG). It is noted that vent holes 184 have a sufficiently small lateral size (across or into page in FIG. 9) compared to source/drain regions 110, 112 that sealing them, as described, does not adversely impact the electrical properties of the source/drain regions. As noted, first air gap 140 and second air gap 142 each have a substantially rectangular cross-sectional shape—due to the shape of the SiGe sections. In embodiments, spacing S between first air gap 140 and second air gap 142 is greater than or equal to a length L of channel region 114 such that air gaps 140, 142 are not under channel region 114.

FIGS. 1-3 show processing after forming silicide 158 over source/drain regions 110, 112, 180. Silicide 158 may be formed using any now known or later developed technique, e.g., performing an in-situ pre-clean, depositing a metal such as titanium, nickel, cobalt, platinum, etc., annealing to have the metal react with silicon of source/drain regions 110, 112, and removing unreacted metal. ILD 160 may be formed thereover, and any desired interconnects, e.g., contacts and wiring (not shown), may be formed therethrough in a known fashion.

In the embodiments of FIGS. 5-10, SiGe sections 170, 172, 174 are not formed in an aligned manner with source/drain regions 110, 112, 180, and thus may result in air gaps 140, 142 that may not be aligned to source/drain regions 110, 112. Here, spacing S may be close to equal, but more likely larger than, length L of channel region 114. Spacing S being larger than length L of channel region 114 is shown in an exaggerated fashion in FIG. 3.

FIGS. 11-14 show cross-sectional views of embodiments in which air gaps 140, 142 are formed in an aligned manner to source/drain regions 110, 112. That is, as shown in FIGS. 1 and 2, sides of first air gap 140 and second air gap 142 are aligned to edges of gate 120 such that spacing S therebetween is equal to length L of channel region 114. As will be described, in these embodiments, trench isolation 124 may be formed in bulk semiconductor substrate 102 prior to forming first SiGe section 170 and second SiGe section 172. Each of air gap(s) 140, 142 may abut trench isolation 124.

Figure 11:
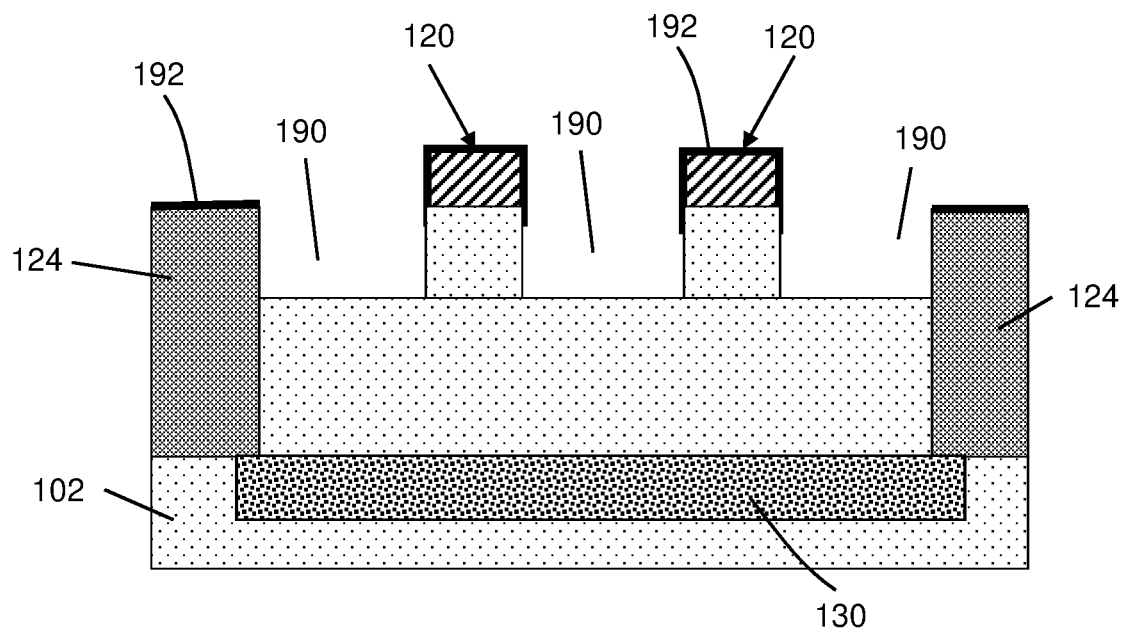
FIG. 11 shows a cross-sectional view of forming a pair of trenches, according to embodiments of the disclosure.

FIG. 11 shows a cross-sectional view in which processing starts from FIG. 4, and forming of gate(s) 120 precedes forming first SiGe section 170 and second SiGe section 172 and forming of silicon layer 150, as in the previous embodiments. Gate(s) 120 may be formed in any manner over bulk semiconductor substrate 102, as described herein. FIG. 11 also shows forming a pair of trenches 190 in bulk semiconductor substrate 102 adjacent gate(s) 120. Another trench 190 may also be provided where two gates 120 are formed adjacent one another. A hardmask 192 may be formed over trench isolation 124 and/or gate(s) 120, and an etching such as a RIE, performed to open trenches 190. Trenches 190 extend into substrate 102 to a depth desired for a bottom of air gaps 140, 142 (FIGS. 1-3).

Figure 12:
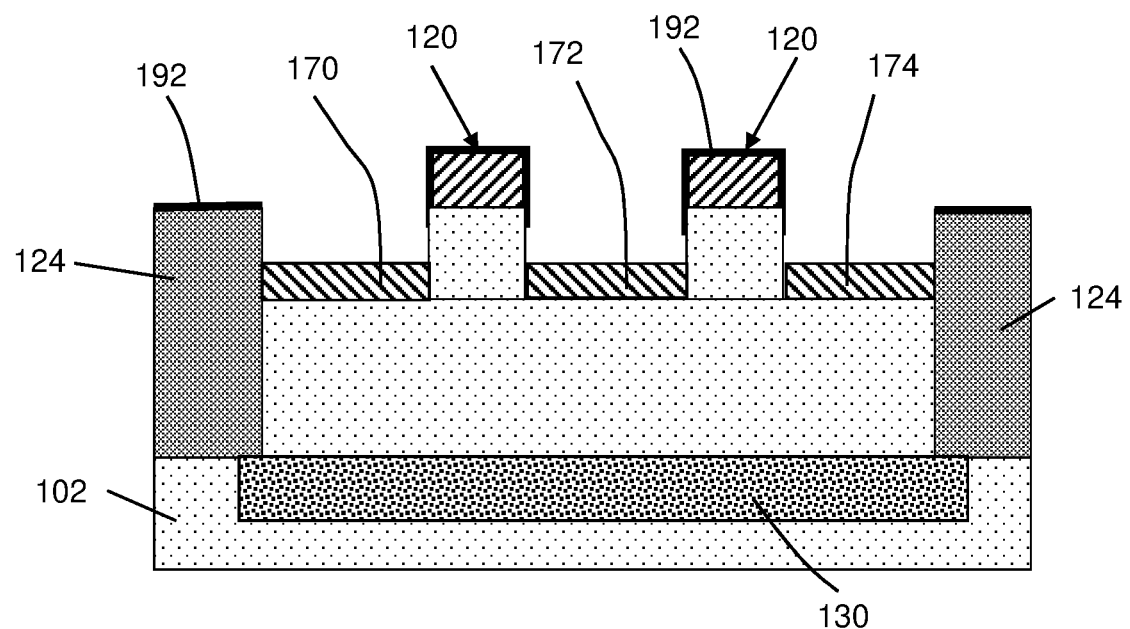
FIG. 12 shows a cross-sectional view of forming silicon germanium sections in the pair of trenches, according to embodiments of the disclosure.
Figure 13:
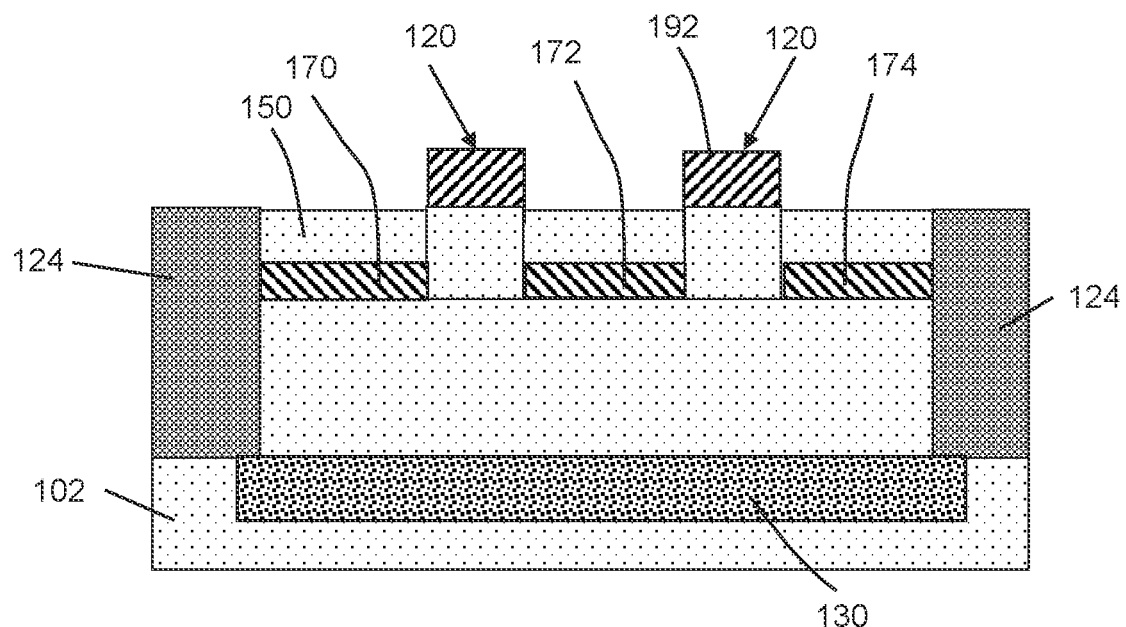
FIG. 13 shows a cross-sectional view of forming a silicon layer, according to embodiments of the disclosure.

FIG. 12 shows a cross-sectional view of epitaxially growing first SiGe section 170 and second SiGe section 172 in pair of trenches 190 (and third SiGe section 174 in another trench 190, where provided). In embodiments, the first SiGe section 170 s epitaxially grown selectively to the source/drain transistor region. FIG. 13 shows a cross-sectional view of epitaxially growing silicon layer 150 over first SiGe section 170 and second SiGe section 172 in pair of trenches 190 (FIG. 11), and third SiGe section 174 where provided. Processing from this point may proceed as described relative to FIGS. 1-3 and 8-10, e.g., gate(s) 120 formation, first and second source/drain region 110, 112 formation, and air gap 140, 142 formation. As shown in FIGS. 1 and 2, sides of first air gap 140 and second air gap 142 are aligned to edges of gate 120 such that spacing S is equal to length L of channel region 114.

Figure 14:
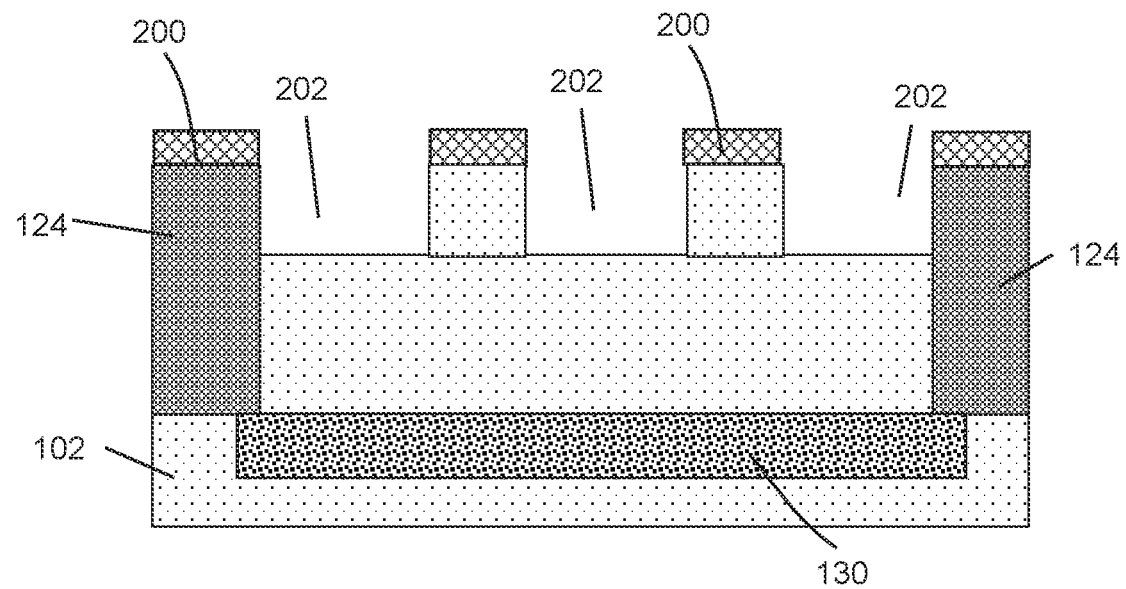
FIG. 14 shows a cross-sectional view of forming a pair of trenches, according to other embodiments of the disclosure.

FIG. 14 shows a cross-sectional view of other embodiments in which sides air gaps 140, 142 are formed in an aligned manner to edges of source/drain regions 110, 112. In this embodiment, rather than using gate(s) 120 to form pair of trenches 190 (FIG. 11), a mask 200 is used. Here, gate(s) 120 are formed after SiGe sections 170, 172, 174. FIG. 14 shows a cross-sectional view in which processing starts from FIG. 4. At this stage, trench isolation 124 is formed in bulk semiconductor substrate 102, and a pair of trenches 202 are formed in bulk semiconductor substrate 102 using a mask 200. Mask 200 (e.g., nitride hard mask) is patterned over bulk semiconductor substrate 102 to expose portions of bulk semiconductor substrate 102 at which air gaps 140, 142 are desired. Pair of trenches 202 are formed in bulk semiconductor substrate 102 adjacent gate(s) 120 by etching using mask 200. Another trench 202 may also be provided where three portions are exposed by mask 200. The etching may include, for example, a RIE. Trenches 202 extend into substrate 102 to a depth desired for a bottom of air gaps 140, 142 (FIGS. 1-3).

Figure 15:
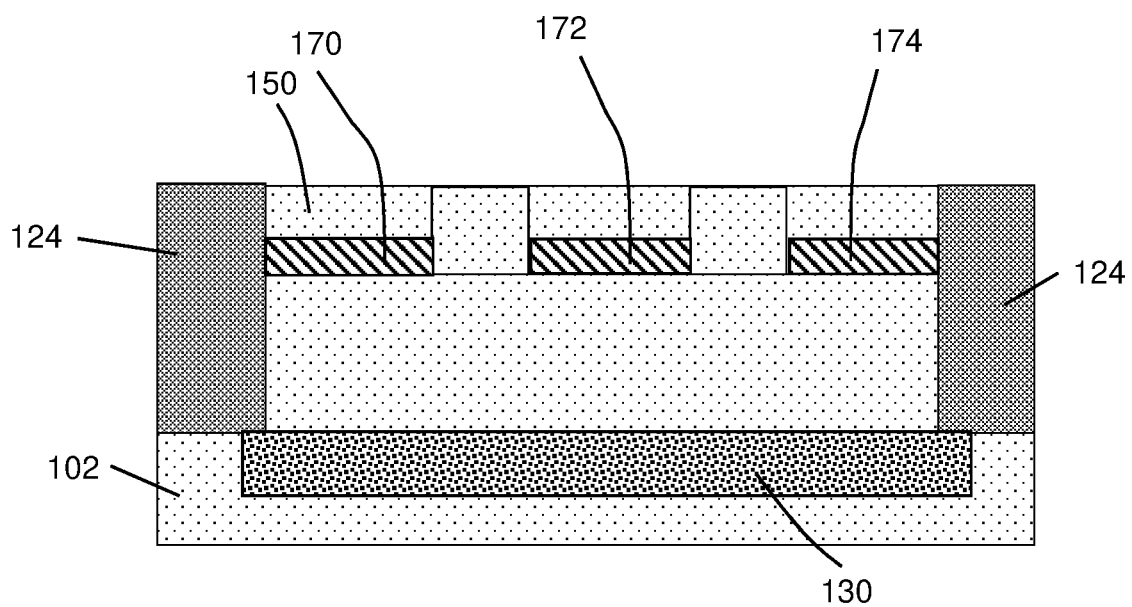
FIG. 15 shows a cross-sectional view of forming silicon germanium sections and a silicon layer, according to embodiments of the disclosure.

FIG. 15 shows a cross-sectional view after removing mask 200 (FIG. 14) (e.g., by any appropriate ashing process), epitaxially growing first SiGe section 170 and second SiGe section 172 in trenches 202, and then epitaxially growing silicon layer 150 over first SiGe section 170 and second SiGe section 172 (in trenches 202 (FIG. 14)). Processing hereafter for this embodiment may proceed as similarly described relative to FIGS. 1-3 and 8-10 to arrive at transistor 100 in FIGS. 1-3.

Embodiments of the disclosure provide transistor 100 exhibiting reduced junction capacitance because of the presence of air gaps 140, 142, even though the transistor is built in a bulk semiconductor substrate 102. Air gaps 140, 142 have a rectangular cross-sectional shape, and extend under source/drain regions 110, 112 but not under channel region 114. In certain embodiments, a side of air gaps 140, 142 is aligned to an edge of gate 120 and channel 114. While SOI substrates typically have approximately 50% lower drain-source capacitance (CDs) compared to bulk semiconductor substrates due to the buried insulator layer, air gaps 140, 142 under source/drain regions 110, 112 reduce the CDS in bulk semiconductor substrate 102. Source/drain regions 110, 112 can also have their thickness configured to be similar to SOI substrates, e.g., to be around 80 nm. The reduction in CDS by air gaps 140, 142 under source/drain regions 110, 112 may be up to approximately 50%, which can reduce off capacitance ($C_{off}$) by up to 25% to approach or match that value in SOI substrates. While air gaps 140, 142 provide this advantage, they are not located under channel region 114, thus eliminating any mechanical stresses caused by that arrangement.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:
1. A transistor, comprising:
a bulk semiconductor substrate;
a first source/drain region in the bulk semiconductor substrate separated from a second source/drain region in the bulk semiconductor substrate by a channel region;
a first air gap defined in the bulk semiconductor substrate and under the first source/drain region;
a second air gap defined in the bulk semiconductor substrate and under the second source/drain region; and
a gate over the channel region, wherein sides of the first air gap and the second air gap are substantially aligned to edges of the gate and the channel region to define a spacing between the first air gap and the second air gap, and the spacing between the first air gap and the second air gap is greater than or equal to a length of the channel region such that the first and second air gaps are not under the channel region.

2. The transistor of claim 1, wherein the first air gap and the second air gap are aligned to the gate such that the spacing is equal to the length of the channel region.

3. The transistor of claim 1, wherein the first air gap is in direct contact with the first source/drain region, and the second air gap is in direct contact with the second source/drain region.

4. The transistor of claim 1, wherein the first air gap and the second air gap each have a substantially rectangular cross-sectional shape.

5. The transistor of claim 1, further comprising:
a trench isolation in the bulk semiconductor substrate and surrounding the first source/drain region and the second source/drain region; and
a doped polysilicon isolation region in the bulk semiconductor substrate extending below the gate, the first source/drain region, the second source/drain region, the first air gap and the second air gap,
wherein the first air gap and the second air gap abut the trench isolation.

6. The transistor of claim 1, wherein the first source/drain region and the second source/drain region have a thickness in the range of 30 to 50 nanometers.

7. The transistor of claim 1, wherein an inner surface of each of the first air gap and the second air gap is a same material as the bulk semiconductor substrate.

8. The transistor of claim 1, further comprising a filled vent hole extending through each of the first source/drain region and the second source/drain region.

9. A transistor, comprising:
a bulk semiconductor substrate;
a first source/drain region in the bulk semiconductor substrate separated from a second source/drain region in the bulk semiconductor substrate by a channel region;
a first air gap defined in the bulk semiconductor substrate and in direct contact with the first source/drain region;
a second air gap defined in the bulk semiconductor substrate and in direct contact with the second source/drain region;
a gate over the channel region; and
a doped polysilicon isolation region in the bulk semiconductor substrate extending below the gate, the first source/drain region, the second source/drain region, the first air gap and the second air gap,
wherein the first air gap and the second air gap each have a substantially rectangular cross-sectional shape and sides of the first air gap and the second air gap are substantially aligned to edges of the gate and the channel region to define a spacing between the first air gap and the second air gap, and the, and a spacing between the first air gap and the second air gap is greater than or equal to a length of the channel region such that the first and second air gaps are not under the channel region.

10. The transistor of claim 9, wherein sides the first air gap and the second air gap are aligned to edges of the gate such that the spacing is equal to the length of the channel region.

* * * * *

UNITED STATES PATENT AND TRADEMARK OFFICE
CERTIFICATE OF CORRECTION

PATENT NO. : 11,605,710 B2
APPLICATION NO. : 17/155469
DATED : March 14, 2023
INVENTOR(S) : Rana et al.

Page 1 of 1

It is certified that error appears in the above-identified patent and that said Letters Patent is hereby corrected as shown below:

In the Claims

Claim 9, Column 14, Line 25 amended as follows: ". . . second air gap, the spacing between the first air gap and the second air gap . . ."

Signed and Sealed this
Twenty-fifth Day of April, 2023

Katherine Kelly Vidal
*Director of the United States Patent and Trademark Office*